United States Patent
Roham et al.

(10) Patent No.: US 9,898,028 B2
(45) Date of Patent: Feb. 20, 2018

(54) LOW VOLTAGE, HIGHLY ACCURATE CURRENT MIRROR

(71) Applicant: QUALCOMM Incorporated, San Diego, CA (US)

(72) Inventors: Masoud Roham, San Diego, CA (US); Liang Dai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 115 days.

(21) Appl. No.: 14/755,435

(22) Filed: Jun. 30, 2015

(65) Prior Publication Data

US 2016/0147247 A1 May 26, 2016

Related U.S. Application Data

(60) Provisional application No. 62/082,266, filed on Nov. 20, 2014.

(51) Int. Cl.
| | | |
|---|---|---|
| *G05F 1/10* | (2006.01) | |
| *G05F 3/26* | (2006.01) | |
| *G01R 19/00* | (2006.01) | |
| *H03F 3/347* | (2006.01) | |
| *H03F 3/50* | (2006.01) | |

(52) U.S. Cl.
CPC ......... *G05F 3/262* (2013.01); *G01R 19/0092* (2013.01); *H03F 3/347* (2013.01);
(Continued)

(58) Field of Classification Search
None
See application file for complete search history.

(56) References Cited

U.S. PATENT DOCUMENTS 4,874,964 A * 10/1989 Kondo ................. H03M 1/745
327/108
6,903,539 B1    6/2005 Hoon et al.
(Continued)

FOREIGN PATENT DOCUMENTS

WO     2006120246 A1    11/2006

OTHER PUBLICATIONS

International Search Report and Written Opinion—PCT/US2015/057172—ISA/EPO—dated Jan. 11, 2016.
(Continued)

*Primary Examiner* — Cassandra Cox
(74) *Attorney, Agent, or Firm* — Patterson & Sheridan, L.L.P. Qualcomm

(57) ABSTRACT

Certain aspects of the present disclosure generally relate to a low voltage, accurate current mirror, which may be used for distributed sensing of a remote current in an integrated circuit (IC). One example current mirror typically includes a first pair of transistors, a second pair of transistors in cascode with the first pair of transistors, a switching network coupled to the second pair of transistors, and a third pair of transistors coupled to the switching network. An input node between the first and second pairs of transistors may be configured to receive an input current for the current mirror, and an output node at the first pair of transistors may be configured to sink an output current for the current mirror, proportional to the input current. This current mirror architecture offers a hybrid low-voltage/high-voltage solution, tolerates low input voltages, provides high output impedance, and offers low area and power consumption.

30 Claims, 4 Drawing Sheets

(52) U.S. Cl.
CPC ....... *H03F 3/505* (2013.01); *H03F 2200/453* (2013.01); *H03F 2200/456* (2013.01); *H03F 2200/474* (2013.01); *H03F 2200/91* (2013.01)

(56) References Cited

U.S. PATENT DOCUMENTS

| | | | |
|---|---|---|---|
| 7,161,432 | B2 | 1/2007 | Brokaw et al. |
| 7,342,390 | B2 | 3/2008 | Tachibana et al. |
| 8,400,220 | B1 | 3/2013 | Joffe et al. |
| 2007/0229166 | A1* | 10/2007 | Shor .................. G05F 3/262 330/288 |
| 2007/0252573 | A1* | 11/2007 | Tachibana ............. G05F 3/30 323/313 |

OTHER PUBLICATIONS

Jafari H M., et al., "Chopper-Stabilized Bidirectional Current Acquisition Circuits for Electrochemical Amperometric Biosensors", IEEE Transactions on Circuits and Systems I: Regular Papers, IEEE, US, vol. 68, No. 5, Apr. 24, 2013 (Apr. 24, 2013), pp. 1149-1157, XP011505601, ISSN: 1549-8328, DOI: 10.1109/TCS1.2013.2248771 p. 1149, left-hand column, line 16—p. 1156, right-hand column, line 15; figures 5,12.

Stornelli V., et al., "High-Accuracy, High-Precision DEM-CCII Amplifiers", Circuits and Systems, 2007. ISCAS 2007. IEEE International Symposium on, IEEE, PI, May 27, 2007 (May 27, 2007), pp. 2196-2199, XP031181734, DOI: 10.1109/ISCAS.2007.378717 ISBN: 978-1-4244-0920-4 p. 2196, left-hand column, line 11—p. 2199, right-hand column, line 2, figure 5.

Cheng K.H., et al., "Accurate Current Mirror with High Output Impedance," The 8th IEEE International Conference on Electronics, Circuits and Systems (ICECS), 2001, vol. 2, pp. 565-568.

Jafari H.M., et al., "Bidirectional Current Conveyer with Chopper Stabilization and Dynamic Element Matching," IEEE, 2012, pp. 1079-1082.

* cited by examiner

LOW VOLTAGE, HIGHLY ACCURATE CURRENT MIRROR

CROSS-REFERENCE TO RELATED APPLICATION

This application claims benefit of U.S. Provisional Patent Application Ser. No. 62/082,266, filed Nov. 20, 2014 and entitled "LOW VOLTAGE, HIGHLY ACCURATE CURRENT MIRROR," which is herein incorporated by reference in its entirety.

TECHNICAL FIELD

Certain aspects of the present disclosure generally relate to electronic circuits and, more particularly, to a low voltage current mirror with a highly accurate current ratio.

BACKGROUND

A current mirror is a type of current amplifier that provides a high impedance output current proportional to an input current. The output current is typically used to drive a load for high gain. A simple current mirror generally consists of a single input and a single output transistor pair, with the gate electrodes of the pair being tied together and to an input voltage node at the drain of the input transistor. The sources of the transistors are connected to a reference voltage node that is common to both transistors. The drain and gate of the input transistor are connected to a current source that provides a quiescent reference current. Because the input and output transistors have their gates and sources tied together, a corresponding output current arises in the conduction path of the output transistor. Generally, the input and output transistors are identical and there is a substantially unity gain in the current. Such current mirrors are commonly used to provide active loads in high gain amplifier stages.

SUMMARY

Certain aspects of the present disclosure generally relate to a low voltage, accurate current mirror circuit, which may be used for distributed current sensing in an integrated circuit (IC), for example.

Certain aspects of the present disclosure provide a current mirror. The current mirror typically includes a first pair of transistors, a second pair of transistors in cascode with the first pair of transistors, a switching network coupled to the second pair of transistors, and a third pair of transistors coupled to the switching network. For certain aspects, an input node between the first and second pairs of transistors is configured to receive an input current for the current mirror, and an output node at the first pair of transistors is configured to sink an output current for the current mirror that is proportional to the input current According to certain aspects, the switching network is configured to periodically (or randomly) interchange connections between the second pair of transistors and the third pair of transistors.

According to certain aspects, the switching network includes a dynamic element matching (DEM) circuit.

According to certain aspects, the current mirror further includes a current source configured to supply a bias current to a transistor in the first pair of transistors. The bias current may be negligible compared to the input current. For certain aspects, the current mirror may also include a source follower coupled to the current source and to the transistor in the first pair of transistors. The source follower may include a first transistor and a second transistor in cascode with the first transistor. In this case, a gate of the first transistor may be coupled to the current source and to a drain of the transistor in the first pair of transistors. A source of the first transistor may be coupled to at least one of a drain of the second transistor or to a gate of the second transistor. For certain aspects, the source follower further includes at least one of: a first capacitor connected between the gate of the first transistor and the source of the first transistor; or a second capacitor connected between the gate of the first transistor and a source of the transistor in the first pair of transistors, wherein the source of the transistor in the first pair of transistors is coupled to the input node. The gate of the second transistor may be coupled to gates of the third pair of transistors. For certain aspects, a source of the transistor in the first pair of transistors is coupled to the input node, and a drain of another transistor in the first pair of transistors is coupled to the output node. For certain aspects, the current source is coupled to a first power supply node, and the third pair of transistors is coupled to a second power supply node having a lower voltage than the first power supply node.

According to certain aspects, the first transistor pair includes a first transistor and a second transistor, and a gate of the first transistor is coupled to a gate of the second transistor. For certain aspects, the second pair of transistors includes a third transistor and a fourth transistor, a gate of the third transistor is coupled to a gate of the fourth transistor, a source of the first transistor is coupled to a drain of the third transistor, and a source of the second transistor is coupled to a drain of the fourth transistor. In this case, the third pair of transistors may include a fifth transistor and a sixth transistor, a gate of the fifth transistor may be coupled to a gate of the sixth transistor, and a first size ratio between the third transistor and the fourth transistor may equal a second size ratio between the fifth transistor and the sixth transistor. A third size ratio between the first transistor and the second transistor may be different from the first size ratio and the second size ratio. The third size ratio may be based on a ratio between a bias current of the current mirror and the output current of the current mirror, a drain of the first transistor may be configured to receive the bias current, and a drain of the second transistor may be configured to sink the output current. In this case, the bias current may be negligible compared to the input current, and a source of the first transistor and a drain of the third transistor may be coupled to the input node. In a first configuration of the switching network, a source of the third transistor may be coupled to a drain of the fifth transistor, and a source of the fourth transistor may be coupled to a drain of the sixth transistor. In a second configuration of the switching network, the source of the third transistor may coupled to the drain of the sixth transistor, and the source of the fourth transistor may be coupled to the drain of the fifth transistor. For certain aspects, the first transistor and the third transistor are in an input and bias currents branch of the current mirror, and the second transistor and the fourth transistor are in an output current branch of the current mirror. The fourth transistor may have a smaller size than the third transistor. The second transistor may have a larger size than the first transistor.

According to certain aspects, a ratio between the input current of the current mirror and the output current of the current mirror is 15:1. However, other current ratios may be used instead.

According to certain aspects, a transistor in the second pair of transistors separates the input node from the switching network.

According to certain aspects, the input node, the second pair of transistors, the switching network, and the third pair of transistors operate in a low voltage domain, and the output node and the first pair of transistors operate in a high voltage domain. In this case, the second pair of transistors may be configured to reduce charge sharing between the low voltage domain and the high voltage domain.

Certain aspects of the present disclosure provide an apparatus for generating an output current that is proportional to an input current. The apparatus generally includes means for receiving the input current; means for generating a bias current; first means for sinking the output current, wherein the output current is proportional to the bias current; second means for sinking the output current in cascode with the first means, wherein the output current is proportional to a sum of the input current and the bias current; third means for sinking the output current; and means for interchanging connections between the second means and the third means, wherein the means for receiving the input current is connected between the first means and the second means.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

EXAMPLE CURRENT MIRROR

In many applications, it may be desirable to measure the actual, real-time current consumption of various blocks (e.g., a central processing unit (CPU), digital signal processor (DSP), etc.) of an integrated circuit (IC). Current sensing of these blocks provides a tool for ever-increasing power management challenges, and may be used as a diagnostic tool or as an active control for power limits management.

Figure 1:
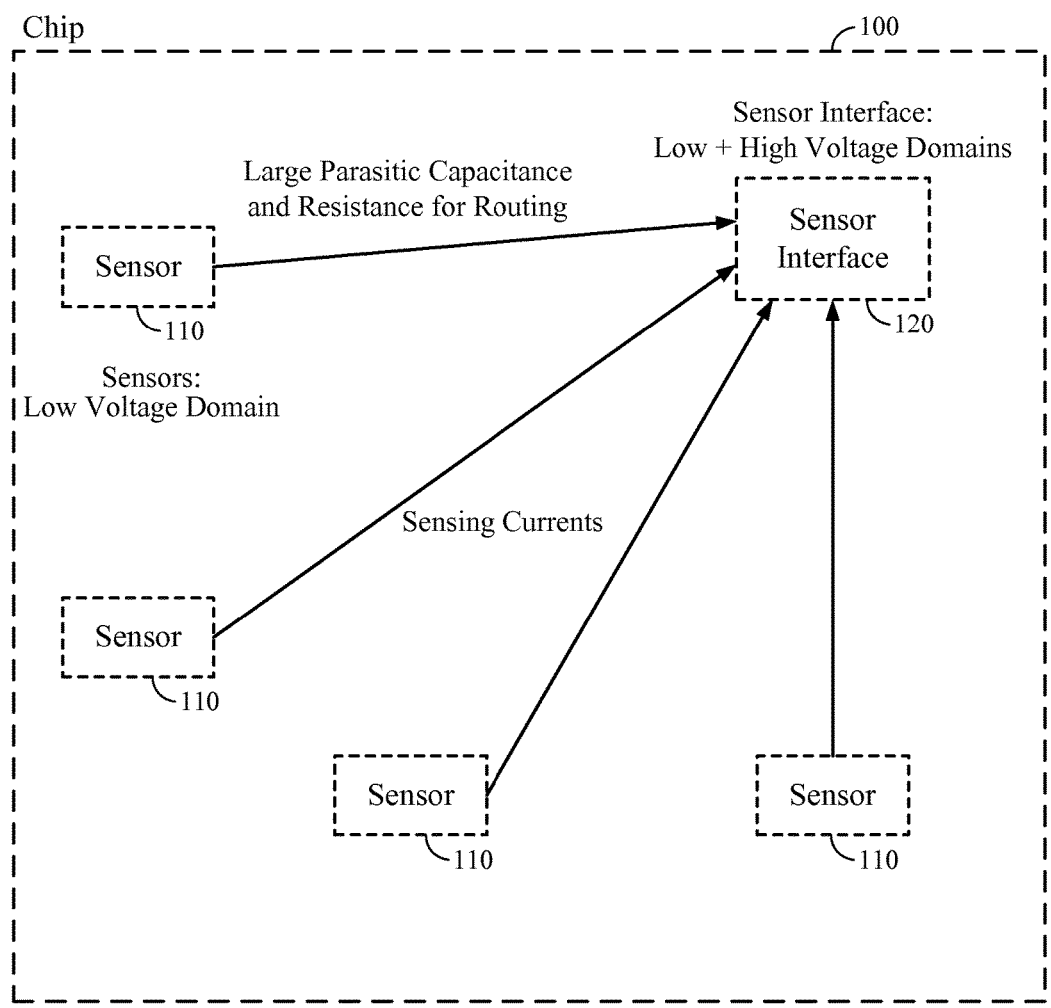
FIG. 1 illustrates distributed on-chip current sensing, in accordance with certain aspects of the present disclosure.

FIG. 1 illustrates an IC 100 (also referred to as a "chip") having multiple current sensors 110, which are distributed in various parts of the IC. In this distributed on-chip current sensing scheme, the IC 100 includes relatively large currents coming from a low-voltage domain that are to be measured with high accuracy at a central sensing interface 120. Often a high-voltage source is available on the sensing interface side of the IC 100, but the currents are provided from the low-voltage domain. In order to measure such currents, a current mirror may be utilized, preferably a current mirror with a sufficiently accurate current ratio, low power consumption, and a small area penalty.

There are multiple issues with conventional current mirrors. For example, due to low available voltage headroom for the mirror in some ICs, certain current mirror circuits may not be functional at all. For example, the power supply voltage (Vdd) in the IC 100 can be as low as 630 mV, and the current-times-resistance (IR) drop in routing from the sensor 110 to the sensing interface 120 may be as high as 150 mV. Moreover, with future technologies, Vdd and the transistor threshold voltage (Vth) both are trending lower, but the IR drop stays the same, so the situation becomes more severe. With respect to area, the size of a conventional current mirror circuit is typically large so that the circuit can handle large currents with minimum gate-to-source voltage (Vgs), which produces large area overhead. Also in a typical current mirror, the current ratio may not be accurate due to mismatch in the transistors. Furthermore, the output impedance of a conventional current mirror is rather limited, typically due to area considerations that avoid large length devices. Adding another row of transistors in cascode is not practical because this limits the voltage headroom even more.

In an attempt to address at least some of these problems in a cascoded current mirror circuit, a small bias current may be injected to the drain of the input transistor, and the input current may be provided at the source of this input transistor. In this case, the input voltage can go down to the drain-to-source voltage (Vds) of the other transistor in the input current branch. This change permits low-voltage operation (e.g., threshold voltage (Vth) may be ~500 mV and Vds may be ~140 mV). Furthermore, a dynamic element matching (DEM) circuit may be used between the cascoded transistor pairs in an effort to average out the mismatch between transistors. However, a current density mismatch between the bias current transistor and the output current transistor in the current mirror topology may introduce a large error, and the output impedance may not be sufficiently high.

Figure 2:
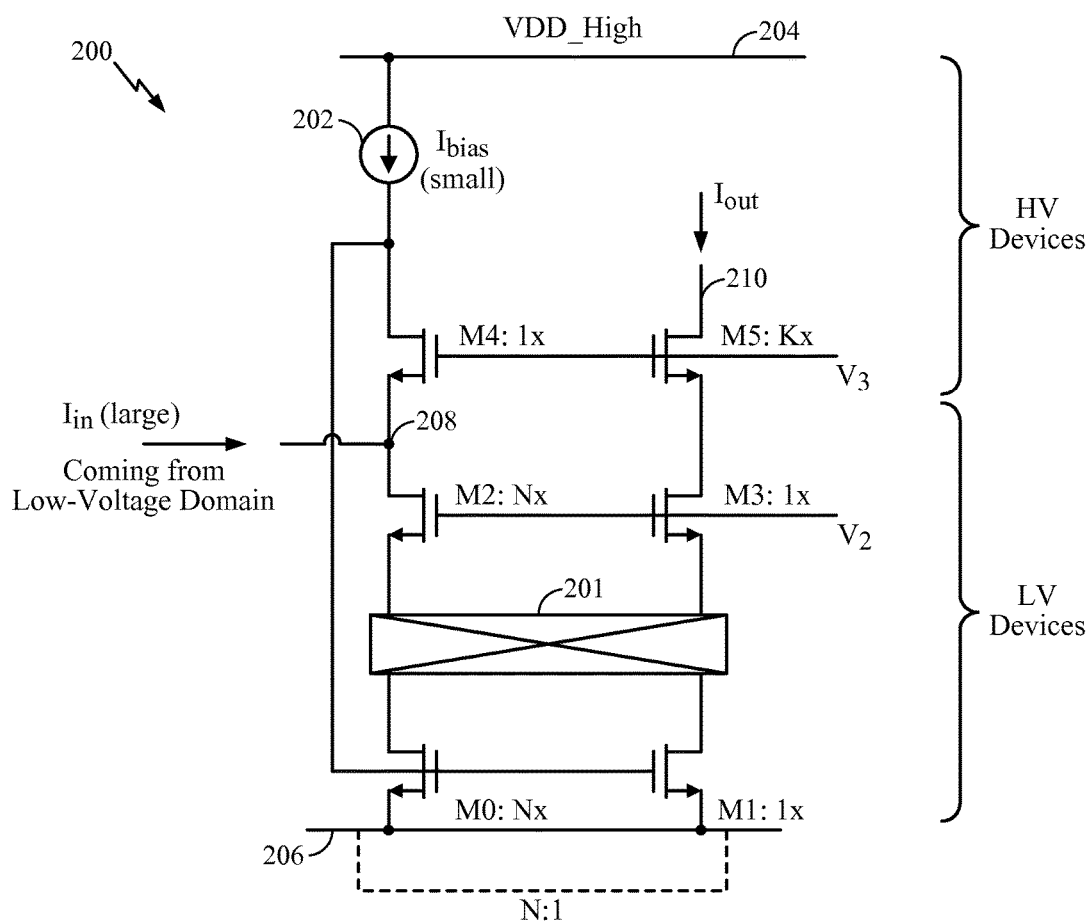
FIG. 2 is an example circuit diagram for a current mirror, in accordance with certain aspects of the present disclosure.

FIG. 2 is an example circuit diagram for a current mirror 200, in accordance with certain aspects of the present disclosure. The current mirror 200 includes a first pair of transistors M4 and M5, a second pair of transistors M2 and M3 connected in cascode with the first pair of transistors M4 and M5, a switching network 201 (e.g., a DEM) coupled to the second pair of transistors M2 and M3, and a third pair of transistors M0 and M1 coupled to the switching network 201. Transistor M4 may function as a bias transistor whose drain is coupled to a bias current source 202 configured to supply a small bias current ($I_{bias}$) from a first power supply node (e.g., VDD_High), also referred to as a power supply (or voltage) rail. For certain aspects, the sources of transistors M0 and M1 are coupled to a second power supply node 206, which may have a lower voltage than the first power supply node 204. For certain aspects, the gates of cascoded transistors M4 and M5 are connected together and biased with a bias voltage ($V_3$), as illustrated in FIG. 2. Likewise, the gates of the second pair of transistors M2 and M3 are connected together and biased with another bias voltage ($V_2$) for certain aspects. For certain aspects, the gates of the third pair of transistors M0 and M1 are also connected together and coupled to the drain of transistor M4, biased by the current source 202, as shown.

The switching network 201 is configured to interchange connections between the second pair of transistors M2 and M3 and the third pair of transistors M0 and M1. For certain aspects, interchanging connections between the pairs of transistors involves switching the source of M2 from being connected with the drain of M0 to being connected with the drain of M1, or vice versa. In this case, interchanging connections with the switching network 201 also involves switching the source of M3 from being connected with the drain of M1 to being connected with the drain of M0, or vice versa. These connections may be interchanged periodically (according to a periodic control signal, such as a clock) or randomly, for example.

In FIG. 2, an input node 208 between the first and second pairs of transistors is configured to receive an input current ($I_{in}$) for the current mirror 200. As described above, $I_{bias}$ may be small, which may mean that $I_{bias}$ is negligible compared to $I_{in}$. For certain aspects, the input node 208 is coupled to the source of transistor M4 and to the drain of transistor M2. An output node 210 at the first pair of transistors is configured to sink an output current ($I_{out}$) for the current mirror 200, where $I_{out}$ is proportional to $I_{in}$. For certain aspects, the output node 210 is coupled to the drain of the transistor M5.

Having a second row of cascoded transistors M2 and M3 in between the switching network 201 and the first row of cascoded transistors M4 and M5 permits the upper devices in FIG. 2 being high voltage (HV) and the lower devices being low voltage (LV), as shown. This hybrid low-voltage/high-voltage solution eliminates the issues described above with conventional current mirrors. The current mirror 200 in FIG. 2 tolerates low input voltages, provides high output impedance, and achieves low area. The second row of cascoded transistors M2 and M3 isolates the switching network 201 to eliminate the charge sharing from two different voltages. Transistor M5 increases the output resistance of the current mirror 200. The size ratio (K) of M5:M4 is decided based on a typical ratio of $I_{out}$ to $I_{bias}$, for example. For certain aspects, the current mirror 200 utilizes an N:1 low-voltage DEM for matching between transistors M0 and M1. The size ratio (N) of M0:M1 (as well as M2:M3) is decided, for example, based on the desired ratio of $I_{out}$ to $I_{in}$ for the current mirror 200. For certain aspects as an example, N is equal to 15.

For certain aspects, the current mirror 200 of FIG. 2 is capable of handling input currents ranging from at least 40 µA to 2.2 mA. Furthermore, the current mirror 200 operates with a minimum power supply voltage of 630 mV, for example, which typically is too low for conventional current mirrors.

Figure 3:
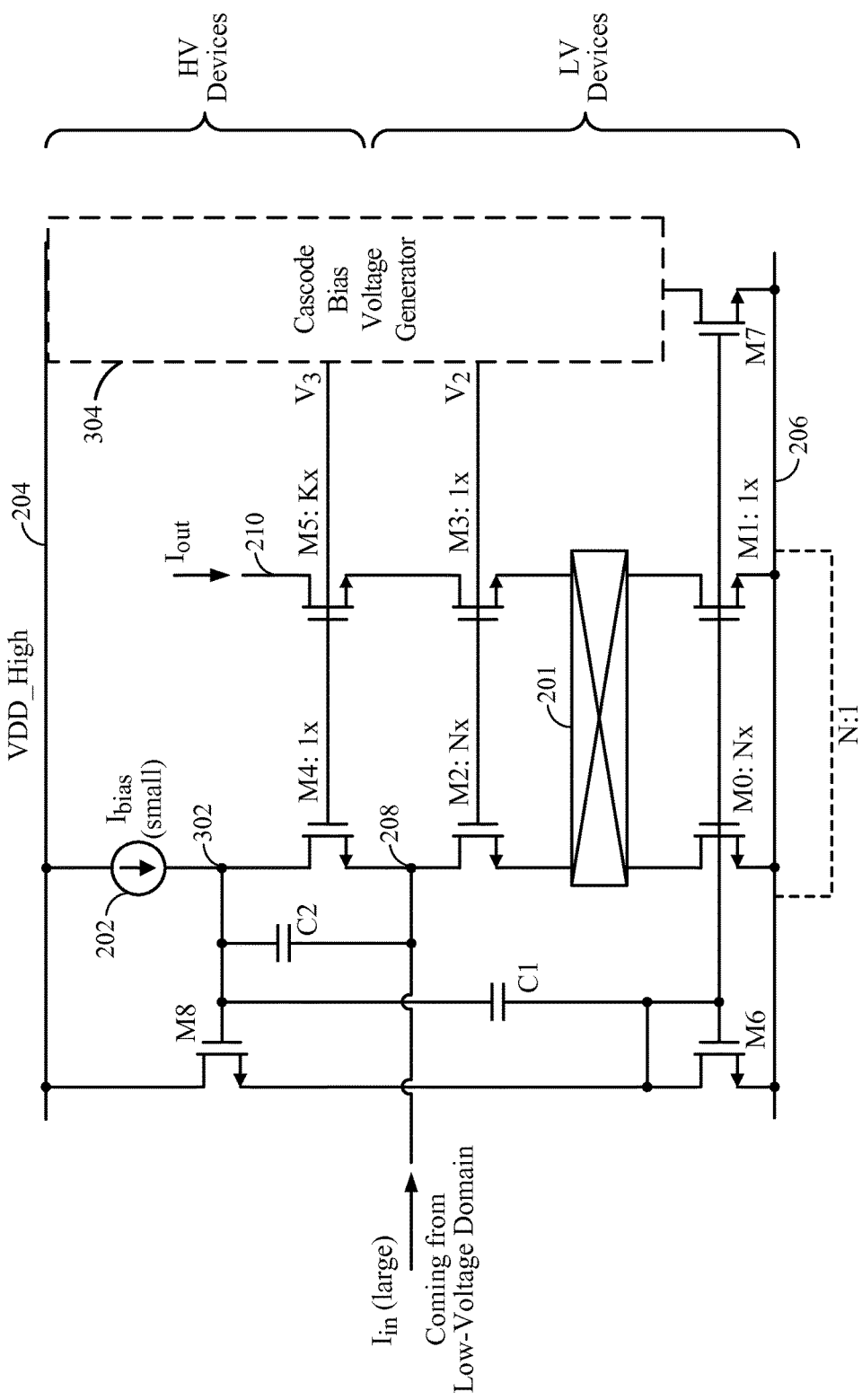
FIG. 3 is an example circuit diagram that adds a source follower to the current mirror of FIG. 2, in accordance with certain aspects of the present disclosure.

FIG. 3 is an example circuit diagram illustrating the addition of a source follower to the current mirror 200 of FIG. 2, in accordance with certain aspects of the present disclosure. The source follower in FIG. 3 includes transistors M6 and M8, which are connected in cascode. The source follower serves to shift the mirror voltage (at the node 302 connected to the drain of M4 and the bias current source 202) to a higher voltage. For certain aspects, the gate of transistor M8 is coupled to node 302, and the source of transistor M8 is coupled to at least one of the drain or the gate of transistor M6. For certain aspects, the drain and the gate of transistor M6 are shorted together.

For certain aspects, capacitors C1 and/or C2 are added for stability. Capacitor C1 may be coupled to the node 302 and to at least one of the source of transistor M8, the gate of transistor M6, the drain of transistor M6, or the gate of transistor M0. Capacitor C2 may be coupled to the node 302 and to the input node 208.

According to certain aspects, the cascode bias voltage generator 304 is used to generate the bias voltages $V_3$ and $V_2$ for the first row of cascoded transistors M4 and M5 and the second row of cascoded transistors M2 and M3, respectively. For certain aspects, the cascode bias voltage generator 304 is coupled to the drain of transistor M7, which may be sized similarly to transistor M1. For certain aspects, the source of transistor M7 is coupled to the second power supply node 206, and the gate of transistor M7 is coupled to the gates of transistors M1, M0, and M6, as shown.

Figure 4:
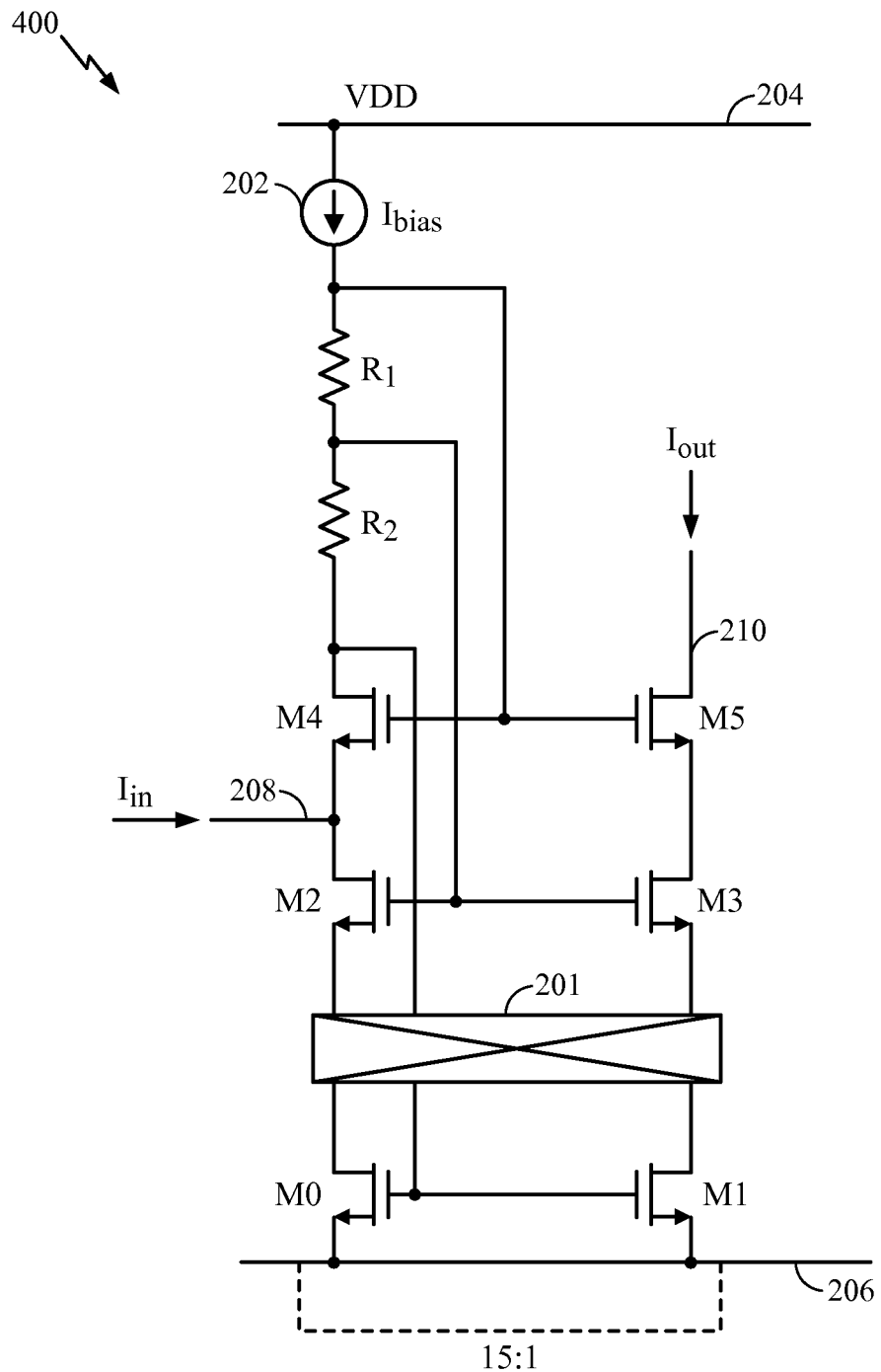
FIG. 4 is an example circuit diagram for a current mirror with a 15:1 input-to-output-current ratio, in accordance with certain aspects of the present disclosure.

FIG. 4 is an example circuit diagram for a current mirror 400 with a 15:1 input-to-output-current ratio ($I_{in}/I_{out}$), in accordance with certain aspects of the present disclosure. The circuit is similar to the current mirror 200 of FIG. 2, where the size ratios of M0:M1 and M2:M3 are both 15:1. Resistors R1 and R2 are added for biasing the gates of the first, second, and third transistor pairs in conjunction with the bias current supplied by the bias current source 202.

The various operations or methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for receiving an input current may comprise a terminal or an input node (e.g., input node 208 as depicted in FIG. 2). Means for generating a bias current may include a current source (e.g., the bias current source 202 as illustrated in FIG. 2). First, second, and/or third means for sinking an output current may each include a pair of transistors (e.g., transistors M4 and M5, transistors M2 and M3, or transistors M0 and M1 as shown in FIG. 2). Means for interchanging connections between the second means and the third means may comprise a switching network (e.g., the switching network 201 as illustrated in FIG. 2).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present invention may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A current mirror comprising:
   a first pair of transistors;
   a second pair of transistors in cascode with the first pair of transistors;
   a switching network coupled to the second pair of transistors;
   a third pair of transistors coupled to the switching network, wherein an input node between the first and second pairs of transistors is configured to receive an input current for the current mirror and wherein a terminal of a transistor of the first pair of transistors is configured to sink an output current for the current mirror that is proportional to the input current; and
   a current source configured to supply a bias current to another transistor in the first pair of transistors.

2. The current mirror of claim 1, wherein the switching network is configured to periodically interchange connections between the second pair of transistors and the third pair of transistors.

3. The current mirror of claim 1, wherein the switching network comprises a dynamic element matching (DEM) circuit.

4. The current mirror of claim 1, wherein the bias current is negligible compared to the input current.

5. The current mirror of claim 1, further comprising a source follower coupled to the current source and to the other transistor in the first pair of transistors.

6. The current mirror of claim 5, wherein:
   the source follower comprises a first transistor and a second transistor in cascode with the first transistor;
   a gate of the first transistor is coupled to the current source and to a drain of the other transistor in the first pair of transistors; and
   a source of the first transistor is coupled to at least one of a drain of the second transistor or a gate of the second transistor.

7. The current mirror of claim 6, wherein the source follower further comprises at least one of:
   a first capacitor connected between the gate of the first transistor and the source of the first transistor; or
   a second capacitor connected between the gate of the first transistor and a source of the other transistor in the first pair of transistors, wherein the source of the other transistor in the first pair of transistors is coupled to the input node.

8. The current mirror of claim 6, wherein the gate of the second transistor is coupled to gates of the third pair of transistors.

9. The current mirror of claim 1, wherein a source of the other transistor in the first pair of transistors is coupled to the input node and wherein a drain of the transistor in the first pair of transistors is coupled to an output node of the current mirror.

10. The current mirror of claim 1, wherein the current source is coupled to a first power supply node and wherein the third pair of transistors is coupled to a second power supply node having a lower voltage than the first power supply node.

11. The current mirror of claim 1, wherein a ratio between the input current of the current mirror and the output current of the current mirror is 15:1.

12. The current mirror of claim 1, wherein a transistor in the second pair of transistors separates the input node from the switching network.

13. The current mirror of claim 1, wherein the input node, the second pair of transistors, the switching network, and the third pair of transistors operate in a low voltage domain and wherein an output node of the current mirror and the first pair of transistors operate in a high voltage domain.

14. The current mirror of claim 13, wherein the second pair of transistors is configured to reduce charge sharing between the low voltage domain and the high voltage domain.

15. The apparatus of claim 1, wherein a drain of the other transistor in the first pair of transistors is coupled to the current source and to gates of the third pair of transistors.

16. A current mirror comprising:
a first pair of transistors comprising a transistor and another transistor;
a second pair of transistors in cascode with the first pair of transistors;
a switching network coupled to the second pair of transistors; and
a third pair of transistors coupled to the switching network, wherein:
an input node between the first and second pairs of transistors is configured to receive an input current for the current mirror;
a terminal of the transistor of the first pair of transistors is configured to sink an output current for the current mirror that is proportional to the input current;
the second pair of transistors comprises a first transistor and a second transistor;
a gate of the first transistor is coupled to a gate of the second transistor;
a source of the other transistor is coupled to a drain of the first transistor; and
a source of the transistor is coupled to a drain of the second transistor.

17. The current mirror of claim 16, wherein a gate of the transistor is coupled to a gate of the other transistor.

18. The current mirror of claim 16, wherein:
the third pair of transistors comprises a third transistor and a fourth transistor;
a gate of the third transistor is coupled to a gate of the fourth transistor; and
a first size ratio between the first transistor and the second transistor equals a second size ratio between the third transistor and the fourth transistor.

19. The current mirror of claim 18, wherein a third size ratio between the transistor and the other transistor is different from the first size ratio and the second size ratio.

20. The current mirror of claim 19, wherein:
the third size ratio is based on a ratio between a bias current of the current mirror and the output current of the current mirror;
a drain of the other transistor is configured to receive the bias current; and
a drain of the transistor is configured to sink the output current.

21. The current mirror of claim 20, wherein the bias current is less than the input current and wherein a source of the other transistor and a drain of the first transistor are coupled to the input node.

22. The current mirror of claim 18, wherein:
in a first configuration of the switching network, a source of the first transistor is coupled to a drain of the third transistor and a source of the second transistor is coupled to a drain of the fourth transistor; and
in a second configuration of the switching network, the source of the first transistor is coupled to the drain of the fourth transistor and the source of the second transistor is coupled to the drain of the third transistor.

23. The current mirror of claim 16, wherein the other transistor and the first transistor are in an input and bias currents branch of the current mirror and wherein the transistor and the second transistor are in an output current branch of the current mirror.

24. The current mirror of claim 16, wherein the second transistor has a smaller size than the first transistor.

25. A current mirror comprising:
a first pair of transistors comprising a transistor and another transistor;
a second pair of transistors in cascode with the first pair of transistors;
a switching network coupled to the second pair of transistors; and
a third pair of transistors coupled to the switching network, wherein:
an input node between the first and second pairs of transistors is configured to receive an input current for the current mirror;
a terminal of the transistor of the first pair of transistors is configured to sink an output current for the current mirror that is proportional to the input current; and
the transistor has a larger size than the other transistor.

26. An apparatus for generating an output current that is proportional to an input current, comprising:
means for receiving the input current;
means for generating a bias current;
first means for sinking the output current, wherein the output current is proportional to the bias current;
second means for sinking the output current in cascode with the first means, wherein the output current is proportional to a sum of the input current and the bias current;
third means for sinking the output current; and
means for interchanging connections between the second means and the third means, wherein the means for receiving the input current is connected between the first means and the second means.

27. The apparatus of claim 26, wherein:
the means for receiving the input current, the second means, the third means, and the means for interchanging connections operate in a low voltage domain;
the first means operates in a high voltage domain; and
the second means is configured to reduce charge sharing between the low voltage domain and the high voltage domain.

28. The apparatus of claim 26, wherein a first ratio for the first means to sink the output current proportional to the bias current is larger than a second ratio for the second means to sink the output current proportional to the sum of the input current and the bias current.

29. The apparatus of claim 26, wherein the bias current is negligible compared to the input current.

30. The apparatus of claim 26, wherein the means for interchanging connections is configured to randomly interchange the connections between the second means and the third means.

* * * * *